United States Patent [19]

Dam et al.

[11] Patent Number: 4,971,948

[45] Date of Patent: Nov. 20, 1990

[54] METHOD OF PATTERNING SUPERCONDUCTIVE OXIDE FILMS BY USE OF DIFFUSION BARRIER

[75] Inventors: Bernard Dam; Gerrit J. Van der Kolk; Maritza G. J. Heijman, all of Eindhoven, Netherlands

[73] Assignee: U.S. Philips Corporation, New York, N.Y.

[21] Appl. No.: 305,230

[22] Filed: Feb. 1, 1989

[30] Foreign Application Priority Data

Aug. 4, 1988 [NL] Netherlands ..................... 8801945

[51] Int. Cl.$^5$ ............................................. B05D 5/12
[52] U.S. Cl. ........................................ 505/1; 505/730; 505/728; 427/62; 427/63; 427/43.1; 156/632; 156/656; 156/659.1
[58] Field of Search ................ 427/62, 63, 43.1, 96; 505/1, 730, 728; 156/632, 659.1, 656

[56] References Cited

PUBLICATIONS

Rice, et al, "Preparation of Superconducting Thin Films of Calcium Strontium Bismuth Copper Oxides by Coevaporation", Appl. Phys. Lett. 52(21), May, 1988, pp. 1828–1830.

Ichikawa, et al, "Effect of Overcoating with Dielectric Films on the Superconductive Properties of the High Tc Y–Ba–Cu–O Films", Jpn. J. Appl. Phys. 27(3), Mar. 1988, L381–383.

Meyer et al, "Spectroscopic Evidence for Passivation of the $La_{1.85}Sr_{0.15}CuO_4$ Surface with Gold", Appl. Phys. Lett. 51(14), Oct. 1987, pp. 1118–1120.

Yan et al, "Water Interaction with the Superconducting", $YBa_2Cu_3O_7$ Phase Appl. Phys. Lett., 51(7), Aug. 1987, pp. 532–534.

*Primary Examiner*—Norman Morgenstern
*Assistant Examiner*—Roy V. King
*Attorney, Agent, or Firm*—Norman N. Spain

[57] ABSTRACT

In a method of manufacturing a device comprising a film of an oxide superconducting material which comprises an alkaline earth metal, another metal component, copper and oxygen. A superconductor precursor material comprising copper oxide, alkaline earth metal fluoride and another metal or metal oxide, is provided on a substrate in the form of a film. The film is covered with a diffusion barrier against water in accordance with a pattern which is complementary to a desired pattern of superconducting material. Subsequently, the superconducting material is formed in the uncovered portions of the pattern by means of a treatment at an increased temperature in the presence of water and oxygen.

7 Claims, 1 Drawing Sheet

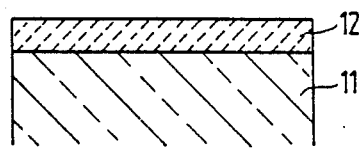
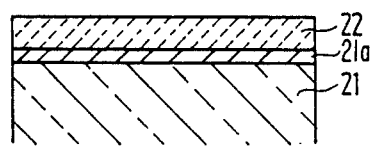
FIG.1a      FIG.2a
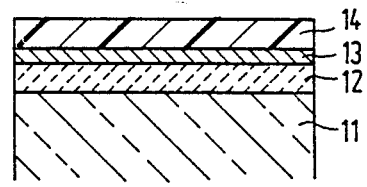
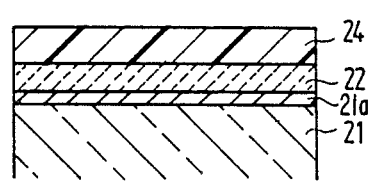
FIG.1b      FIG.2b
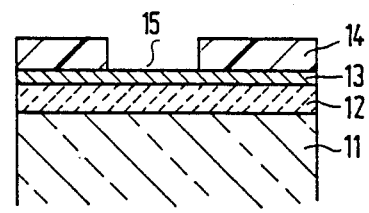
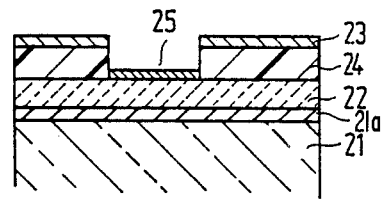
FIG.1c      FIG.2c
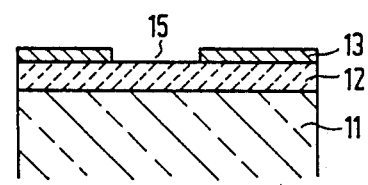
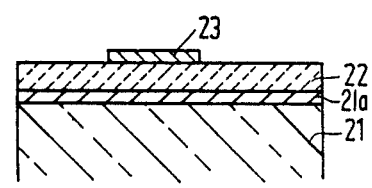
FIG.1d      FIG.2d
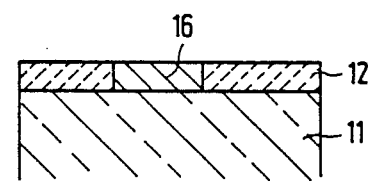
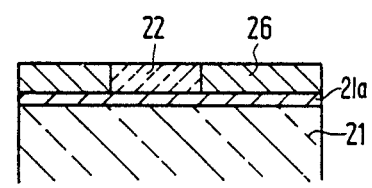
FIG.1e      FIG.2e

METHOD OF PATTERNING SUPERCONDUCTIVE OXIDE FILMS BY USE OF DIFFUSION BARRIER

This case is related to U.S. Pat. No. 4,900,709.

BACKGROUND OF THE INVENTION

The invention relates to a method of manufacturing a device comprising a film of an oxidic superconducting material in a desired pattern, which material comprises at least an alkaline earth metal, according to which method the component elements of the superconducting material are provided on a substrate in the form of a film, the alkaline earth metal being provided in the form of alkaline earth metal fluoride, after which the superconducting material is formed by means of a treatment at an increased temperature in the presence of water and oxygen.

In an article by P. M. Mankiewich et al. in Appl. Phys. Lett. 51(21), pages 1753–1755 (1987) a method is described in which a film of Y, Cu and $BaF_2$ is provided on a substrate of $SrTiO_3$ by means of vacuum deposition. $BaF_2$ is used instead of, for example, Ba metal or BaO because it has a much smaller sensitivity to moisture. The film thickness is of from 100 to 500 nm. $YBa_2Cu_3O_7$ is formed in an oxidation step in oxygen at 800° to 920° C. in 0.5 to 6 hours, which material exhibits superconductive behavior at temperatures below a critical temperature $T_c$ of from 85 to 92 K. Patterns are formed in the film thus obtained by means of scribing or, in a more accurate manner, by means of a positive photolithographic method which is carried out before or after the oxidation step and by means of which patterns having details of 2 μm and larger can be formed. In accordance with a first embodiment the substrate is coated with a photoresist, exposed to light and developed according to a desired pattern after which a film of Y, Cu and $BaF_2$ is provided by means of vacuum deposition. By dissolving the residual resist material the overlying parts of the film become detached ("lift-off"), after which the oxidation step can be carried out to form the superconducting material. In accordance with a second embodiment, first the starting materials are provided by means of vacuum deposition and the oxidation step is carried out, after which the film is coated with a photoresist which is exposed to light and developed in accordance with a desired pattern, after which the superconducting film is etched by means of a diluted acid.

In an article by A. M. Degantolo et al. in Appl. Phys. Lett. 52 (23), pages 1995–1997 (1988) a description is given of a method in which a film of $Y_2O_3$, CuO and $BaF_2$ is provided on a substrate of $SrTiO_3$ by means of laser ablation of a target plate formed from a mixture of the said starting materials. Subsequently, an oxidation step in oxygen is carried out at 850° C. for 1 hour. The oxygen flow contains a quantity of water in order to enable the conversion into $YBa_2Cu_3O_7$. In the case of a film having a thickness of 0.63 μm a critical temperature of 90 K. was observed.

In an article by C. E. Rice et al. in Appl. Phys. Lett. 52 (21), pages 1828–1830 (1988) a description is given of a method in which a film of $CaF_2$, $SrF_2$, Bi and Cu, to which Y and/or Pb may be added, is applied to a substrate of $SrTiO_3$ or sapphire by means of vacuum deposition. Subsequently, an oxidation step in moist oxygen is carried out for 15 min. at 725° C. and 5 min. at 850° C. A Ca-Sr-Bi-Cu oxide or a mixture of such oxides is formed having a critical temperature of approximately 80 K. Patterns are formed in the superconducting film having a thickness of from 300 to 500 nm by means of a photolithographic process and etching using a diluted acid.

The photolithographic processes described hereinbefore, which are used to form a pattern in superconducting films have a number of disadvantages. In the "lift-off" method organic resist material is present before the starting materials are provided. Owing to this, the temperature range in which deposition can take place is limited. When the residual resist material is removed, for example by using acetone, there is the risk that carbon is incorporated in the superconducting film. Structures having details which are smaller than 2 μm can hardly be formed by means of this method. The second method, which comprises etching, is slow because the starting materials must be dissolved in diluted acid. Moreover, this method is not accurate either because underetching takes place. Both methods have the disadvantage that the pattern formed has no flat surface which may be problematic when additional films must be provided to manufacture a device such as, for example, a semiconductor device.

SUMMARY OF THE INVENTION

It is an object of the invention to provide a method by means of which patterns can be accurately manufactured in films of oxidic superconducting materials, which patterns may exhibit small structures, for example, having details of 1μm and larger. Preferably, the superconducting material does not directly contact organic solvents. The invention must enable the manufacture of patterns having a flat surface. An additional requirement is that the method and the film formed are not extremely sensitive to the action of moisture from the environment.

This object is achieved in accordance with the invention by a method as described in the opening paragraph, in which during the treatment at an increased temperature the film is coated with a diffusion barrier against water, in accordance with a pattern which is complementary to the desired pattern. In this way it is achieved that the part of the film underneath the diffusion barrier is not converted into superconducting oxidic material in the oxidation step.

In the method in accordance with the invention the necessary alkaline earth metals are provided in the form of alkaline earth metal fluorides. In accordance with a particular embodiment of the method in accordance with the invention, the other component elements of the superconducting material, excluding oxygen and, if desired, fluorine, are provided in the form of the corresponding metal. In another suitable embodiment the method in accordance with the invention, the other component elements are provided in the form of a corresponding metal oxide.

In a preferred embodiment of the method in accordance with the invention, the material of the diffusion barrier is selected such that it also forms a diffusion barrier against oxygen. In this manner a very clear separation is obtained in the device between superconducting and non-superconducting portions of the pattern in the film provided.

For example, Si, Al and oxides of Si or Al can be used as the material for the diffusion barrier. In the non-prepublished Netherlands Patent Application NL 8701718 it is stated that these materials may disturb the superconducting properties when they contact the oxidic superconducting material at a high temperature. In the oxidation step of the method in accordance with the invention, however, the materials contact those portions of the film which are not to be converted into superconducting material.

If it is desired to provide further superconducting films for the manufacture of a device, and to preclude the adverse effects of the possible lateral diffusion of Si or Al, efficaciously, a material is selected for the diffusion barrier which on contacting the oxidic superconducting material does not react therewith in a manner such that no superconducting behaviour occurs at the desired operating temperature of the device.

It is known per se that in particular noble metals have this property. However, silver is unsuitable as a diffusion barrier against water and/or oxygen. In a preferred embodiment of the method in accordance with the invention the diffusion barrier is formed by a film of gold.

The alkaline earth metals which can be used in the method in accordance with the invention comprises Ca, Sr and Ba.

In a preferred embodiment of the method in accordance with the invention the oxidic superconducting material consists of $YBa_2Cu_3O_{7-\delta}$, wherein $\delta$ has a value of from 0.1 to 0.5. $YBa_2Cu_3O_{7-\delta}$ has a value of $T_c$ approximately 90 K. Oxygen may be partly substituted by fluorine, for example up to 1 atom in the compositional formula indicated, which leads to an increase of $T_c$. Further, Y may be substituted by one or more rare earth metals such as La, and Ba may be substituted by another alkaline earth metal, for example Sr.

In accordance with another embodiment of the method in accordance with the invention the oxidic superconducting material comprises a Ca-Sr-Bi-Cu oxide or a mixture of Ca, Sr and Bi-containing cuprates having a $T_c$ exceeding 100 K., for example $Bi_{2.2}Sr_2Ca_{0.8}Cu_2O_8+\alpha$. The method in accordance with the invention may also be used for the manufacture of patterned films of superconducting cuprates which besides Tl also contain Ca and/or Ba.

The method in accordance with the invention may be used with thin films having a thickness of for example 0.1 to 10 $\mu$m or with films which are manufactured by means of a thick-film technique, for example by means of screen printing. Thin films can be manufactured by means of vacuum deposition, sputtering, laser ablation, chemical deposition from the vapour phase or any other desired technique.

The invention will not be explained in more detail by means of exemplary embodiments and with reference to the figures of the drawing, in which FIGS. 1 a–e diagrammatically shows a number of steps in a method of manufacturing a device in accordance with the invention, and FIGS. 2 a–e diagrammatically shows an alternative embodiment of a method in accordance with the invention.

EXAMPLE 1

A substrate 11 of $SrTiO_3$ is coated with a film 12 of $Y_2O_3$, CuO and $BaF_2$ by means of laser ablation, see FIG. 1a, for example, using the method described in the above-mentioned article by A. M. Degantolo et al. Other substrates, such as $Y_2BaCuO_5$, and other deposition methods, such as vacuum deposition may alternatively be used in the method in accordance with the invention. In the present example, the film thickness is 500 nm.

A film of gold 13 is provided by means of sputtering or vacuum deposition, see FIG. 1b, to which a film 14 of a UV-sensitive photoresist is applied by means of spinning. A suitable photoresist is, for example, AZ 1512 marketed by the firm of Hoechst. After exposure to light and developing, using 0.1N NaOH in water, apertures 15 are formed in the photoresist film, see FIG. 1c. The exposed portion of the gold film is etched with $KI/I_2$ in water after which the residual photoresist material is removed, see FIG. 1d. If desired, the gold film can also be removed by means of Ar ion etching.

Subsequently, an oxidation step is carried out in moist oxygen at 850° C. for 1 hour. Oxidic superconducting material 16 is formed in the uncovered portions of the film, the composition of the oxidic superconducting material being $YBa_2Cu_3O_{6.7}$. The other portions of the film 12 are not converted into superconducting material, see FIG. 1e. If desired, the remaining quantity of gold may be removed.

By means of the method described herein patterns can be formed having details smaller than approximately 1 $\mu$m.

EXAMPLE 2

In the following alternative method in accordance with the invention, a superconducting film formed from a mixture of Ca-Sr-Bi cuprates is manufactured, a gold pattern being used which is obtained by means of a "lift-off" method. If desired, this method may also be carried out such that the superconducting material does not directly contact an organic solvent, for example by applying the gold film in the manner described in Example 1.

A substrate 21 of Si having a buffer film of $SrTiO_3$ 21a is coated with a film 22 of $CaF_2$, $SrF_2$, Bi and Cu by means of vacuum deposition, see FIG. 2a. Subsequently, a film of a photoresist 24 is provided, for example, of the composition described in Example 1, see FIG. 2b. After exposure to light and developing, in which operation apertures 25 are formed in the film, a film of gold 23 is applied by means of vacuum deposition, see FIG. 2c. The remaining photoresist material is dissolved in acetone, thereby removing the overlying portions of the gold film, see FIG. 2d.

Subsequently, an oxidation step is carried out, for example as described in the above-mentioned article by C. E. Rice et al. In accordance with the previous example the portions of the film 22 which are not covered with gold are converted into superconducting material 26, see FIG. 2e.

What is claimed is:

1. A method of manufacturing a film of a copper oxide based superconducting material in a desired pattern, said superconducting material comprising an alkaline earth metal, copper, another metal component and oxygen in which method a superconductor precursor material comprising copper oxide, alkaline earth metal fluoride and another metal or metal oxide is provided on a substrate in the form of a film, applying a diffusion barrier formed of a material selected from the group consisting of gold, silicon and aluminum and oxides of silicon and of aluminum against water and oxygen in a pattern complementary to the desired pattern on said film and subsequently heating said film with said patterned diffusion barrier to an elevated temperature in the presence of water and oxygen such that the film not covered by the diffusion barrier becomes superconducting.

2. A method as claimed in claim 1, characterized in that the another metal component is provided in said form.

3. A method as claimed in claim 1, characterized in that the another metal component provided in the form of a corresponding metal oxide.

4. A method as claimed in claim 1 characterized in that the diffusion barrier is formed by a film of gold.

5. A method as claimed in claim 1 characterized in that the alkaline earth metal is Ca, Sr or Ba.

6. A method as claimed in claim 5, characterized in that the oxide superconducting material comprises $YBa_2Cu_3O_{7-\delta}$, wherein $\delta$ has a value of from 0.1 to 0.5.

7. A method as claimed in claim 5, characterized in that the oxide superconducting material comprises a Ca-Sr-Bi-Cu oxide.

* * * * *